(12) United States Patent
Miyazaki et al.

(10) Patent No.: US 11,948,827 B2
(45) Date of Patent: Apr. 2, 2024

(54) SUBSTRATE SUPPORT MECHANISM, SUBSTRATE CLEANING DEVICE AND SUBSTRATE PROCESSING METHOD

(71) Applicant: EBARA CORPORATION, Tokyo (JP)

(72) Inventors: Mitsuru Miyazaki, Tokyo (JP); Hisajiro Nakano, Tokyo (JP); Takuya Inoue, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 12 days.

(21) Appl. No.: 17/838,248

(22) Filed: Jun. 12, 2022

(65) Prior Publication Data

US 2022/0401997 A1   Dec. 22, 2022

(30) Foreign Application Priority Data

Jun. 16, 2021 (JP) ................. 2021-099799

(51) Int. Cl.
*H01L 21/687* (2006.01)
*B08B 3/02* (2006.01)
*B08B 13/00* (2006.01)
*H01L 21/67* (2006.01)

(52) U.S. Cl.
CPC ........ *H01L 21/68728* (2013.01); *B08B 3/022* (2013.01); *B08B 13/00* (2013.01); *H01L 21/67028* (2013.01)

(58) Field of Classification Search
None
See application file for complete search history.

(56) References Cited

U.S. PATENT DOCUMENTS

2008/0052948 A1\* 3/2008 Kim ................. B23B 31/28
34/317
2013/0233361 A1\* 9/2013 Egashira ........... H01L 21/67051
134/153

FOREIGN PATENT DOCUMENTS

JP        2015153761        8/2015

\* cited by examiner

*Primary Examiner* — Mikhail Kornakov
*Assistant Examiner* — Ryan L Coleman
(74) *Attorney, Agent, or Firm* — JCIPRNET

(57) ABSTRACT

The disclosure provides one technique for suppressing wear of a cleaning member and unexpected dust generation. A substrate support mechanism 100 includes a first support part 110 which is swingable and has a contact region that can come into contact with a peripheral edge of one surface of a substrate W in a closed state, a second support part 120 which supports the other surface of the substrate W, and a first support part moving part 140 which swings the first support part 110.

14 Claims, 13 Drawing Sheets

SUBSTRATE SUPPORT MECHANISM, SUBSTRATE CLEANING DEVICE AND SUBSTRATE PROCESSING METHOD

CROSS-REFERENCE TO RELATED APPLICATION

This application claims the priority benefits of Japanese application no. 2021-099799, filed on Jun. 16, 2021. The entirety of the above-mentioned patent application is hereby incorporated by reference herein and made a part of this specification.

BACKGROUND

Technical Field

The disclosure relates to a substrate support mechanism that supports a substrate such as a semiconductor wafer, a substrate cleaning device that has the substrate support mechanism, and a substrate processing method that uses the substrate support mechanism.

Description of Related Art

A conventional substrate cleaning device is known, which has a chuck that supports a substrate W and a rotation mechanism that rotates the substrate W supported by the chuck (see Patent Literature 1 (Japanese Patent Laid-Open No. 2015-153761)). In such a substrate processing and cleaning device, the front surface and the back surface of the substrate are gripped by a chuck arm, and a tip portion of the chuck arm protrudes toward the front surface side with a relatively long length.

When the chuck arm as shown in Patent Literature 1 is adopted, it is conceivable to swing the pencil cleaning member only to the inside of the peripheral edge of the chuck arm so that the pencil cleaning member does not come into contact with the chuck arm. In that case, however, there is a problem that the peripheral edge portion of the substrate cannot be cleaned by the pencil cleaning member. It is also conceivable to swing the pencil cleaning member to the outside of the peripheral edge of the substrate so as to clean the peripheral edge portion of the substrate, but in that case, the pencil cleaning member may come off or the chuck arm may lose grip of the substrate. Further, in this case, the pencil cleaning member is likely to be worn and may cause unexpected dust generation. The same applies to the roll cleaning member. If the roll cleaning member comes into contact with the tip portion of the chuck arm, the roll cleaning member is likely to be worn and may cause unexpected dust generation.

SUMMARY

The disclosure provides, as the first aspect, to support the back surface of the substrate and the front surface of the substrate at different positions in the in-plane direction. In the second aspect, which will be described later, the disclosure suppresses generation of dust, and in the third aspect, the disclosure more reliably cleans the peripheral edge portion of the substrate.

A substrate support mechanism according to the first aspect of the disclosure may include a first support part that has a contact region capable of coming into contact with a peripheral edge of one surface of a substrate in a closed state; a second support part that supports the other surface of the substrate; and a first support part moving part that moves the first support part from an open state to the closed state.

A substrate support mechanism according to the second aspect of the disclosure may include a support part that supports a substrate in a closed state. The support part may include a first extending portion that extends along an in-plane direction of the substrate, and a second extending portion that extends from the first extending portion to one side. The substrate may be supported at a tip of the second extending portion. The first extending portion may be located on the other surface side of the substrate. The support part may swing to be set to the closed state. A first magnet may be provided in the first extending portion. A second magnet may be provided between the substrate and the first extending portion at a position facing the first magnet. A swinging force may be applied toward an inner side of a peripheral edge of the contact region by a repulsive force between the first magnet and the second magnet.

A substrate cleaning device according to the third aspect of the disclosure may include a plurality of support parts that support a substrate in a closed state; a rotating part that rotates the substrate; and a supply part that supplies a cleaning liquid to the substrate. The support parts may be set to an open state randomly or in order when the substrate rotates.

In the following, the "support part" in the second aspect and the third aspect will be read as "first support part," and further limited aspects will be described.

In each of the above aspects of the disclosure, the first support part may not contact with the other surface of the substrate.

In each of the above aspects of the disclosure, the second support part may be provided on a straight line which connects the contact region and a center point of the substrate in an in-plane direction.

In each of the above aspects of the disclosure, a tip portion of the first support part may be continuously narrowed in width.

In each of the above aspects of the disclosure, the tip portion of the first support part may be inclined and protrude toward inside of the peripheral edge.

In each of the above aspects of the disclosure, an apex or a top surface of the tip portion of the first support part may be located on one side of the substrate at a position of 0.5 mm or less from one surface of the substrate.

In each of the above aspects of the disclosure, the first support part may swing to be set to the closed state, and swing of the first support part may be realized by a magnetic force.

In each of the above aspects of the disclosure, the first support part may include a first extending portion that extends along the in-plane direction of the substrate, and a second extending portion that extends from the first extending portion to one side. The contact region may be provided at a tip of the second extending portion, and the first extending portion may be located on the other surface side of the substrate.

In each of the above aspects of the disclosure, the first support part may swing to be set to the closed state. A first magnet may be provided in the first extending portion, and a second magnet may be provided between the substrate and the first extending portion at a position facing the first magnet. A swinging force may be applied toward an inner side of a peripheral edge of the contact region by a repulsive force between the first magnet and the second magnet.

In each of the above aspects of the disclosure, a plurality of sets of first magnets and second magnets that form pairs may be provided, and the first magnets and the second magnets may rotate together with the substrate when the substrate rotates.

In each of the above aspects of the disclosure, a plurality of arm parts may be provided on the other surface side of the substrate and extend toward outside of the peripheral edge in the in-plane direction, and the second magnets may be provided in the arm parts.

In each of the above aspects of the disclosure, the second support part may be provided on the arm part.

In each of the above aspects of the disclosure, the first support part moving part may be located on the other side of the first extending portion, and move the first extending portion to one side to move a tip portion of the second extending portion to an outer side of the peripheral edge.

In each of the above aspects of the disclosure, a plurality of first support parts may be provided, and the first support parts may be set to the open state randomly or in order when the substrate rotates.

In each of the above aspects of the disclosure, four or more first support parts may be provided, and at a certain time, three or more first support parts may support the substrate, but the remaining first support part may not support the substrate.

Each of the above aspects of the disclosure may include the above-described substrate support mechanism; and a swing part for swinging a cleaning member for cleaning the substrate in a plane of the substrate. The cleaning member may be moved to outside of the peripheral edge of the substrate.

A substrate processing method according to the disclosure may include supporting the other surface of a substrate by a second support part; supporting a peripheral edge of one surface of the substrate by moving a plurality of first support parts from an open state to a closed state; rotating the substrate; and supplying a cleaning liquid to the substrate. The first support parts may be set to the open state randomly or in order when the substrate rotates.

According to the first aspect of the disclosure, the back surface of the substrate and the front surface of the substrate can be supported at different positions in the in-plane direction.

DESCRIPTION OF THE EMBODIMENTS

First Embodiment

[Configuration]

Figure 2:
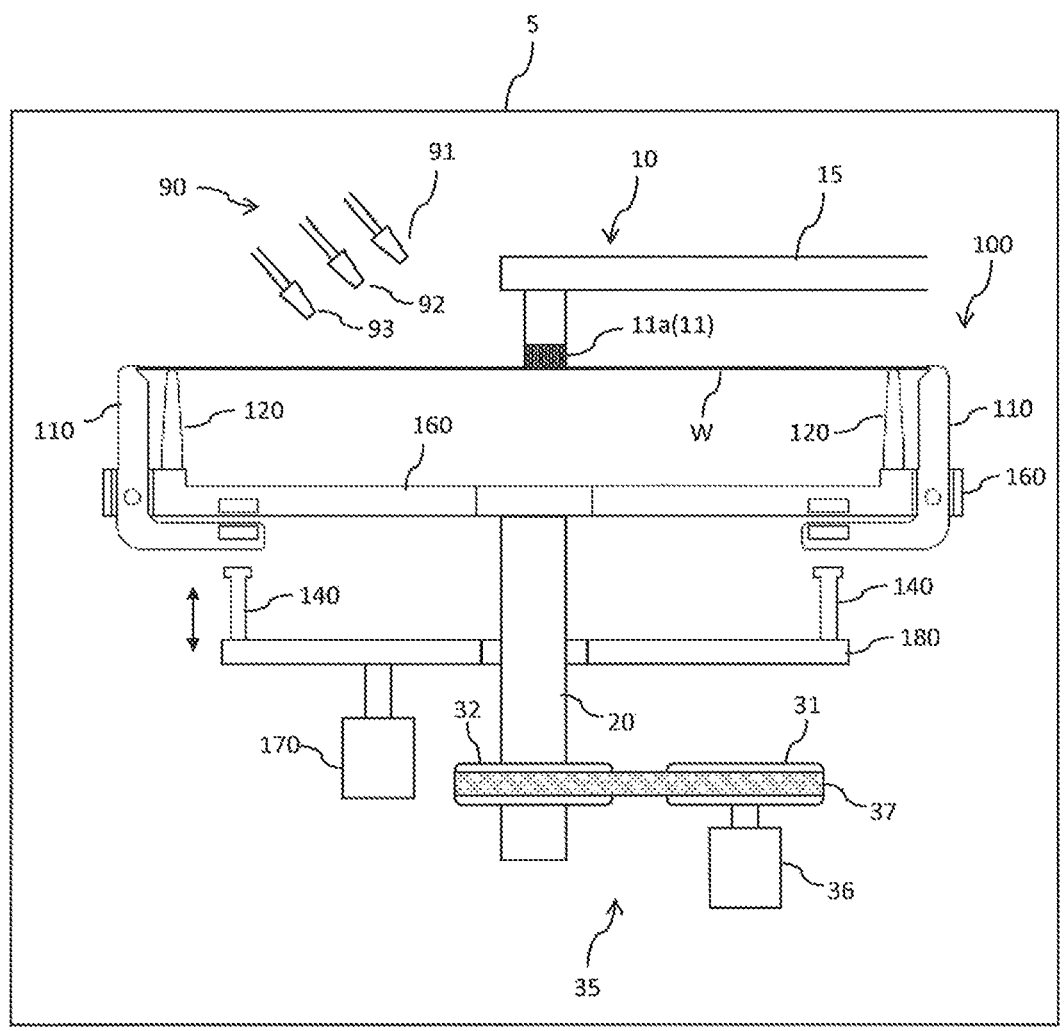
FIG. 2 is a side cross-sectional view of the substrate cleaning device according to the first embodiment of the disclosure.

Hereinafter, embodiments of a substrate processing device having a substrate cleaning device according to the disclosure will be described with reference to the drawings. In this embodiment, the "front surface side of the substrate W" means the upper side of FIG. 2, the "back surface side of the substrate W" means the lower side of FIG. 2, the normal direction of the substrate W is referred to as the "first direction," and the in-plane direction of the substrate W is referred to as the "in-plane direction." The plane including the second direction and the front-back direction (third direction) of the paper surface of FIG. 2 is the in-plane direction. The "front surface side of the substrate W" is also referred to as "one side," and the "back surface side of the substrate W" is also referred to as "the other side."

Figure 1:
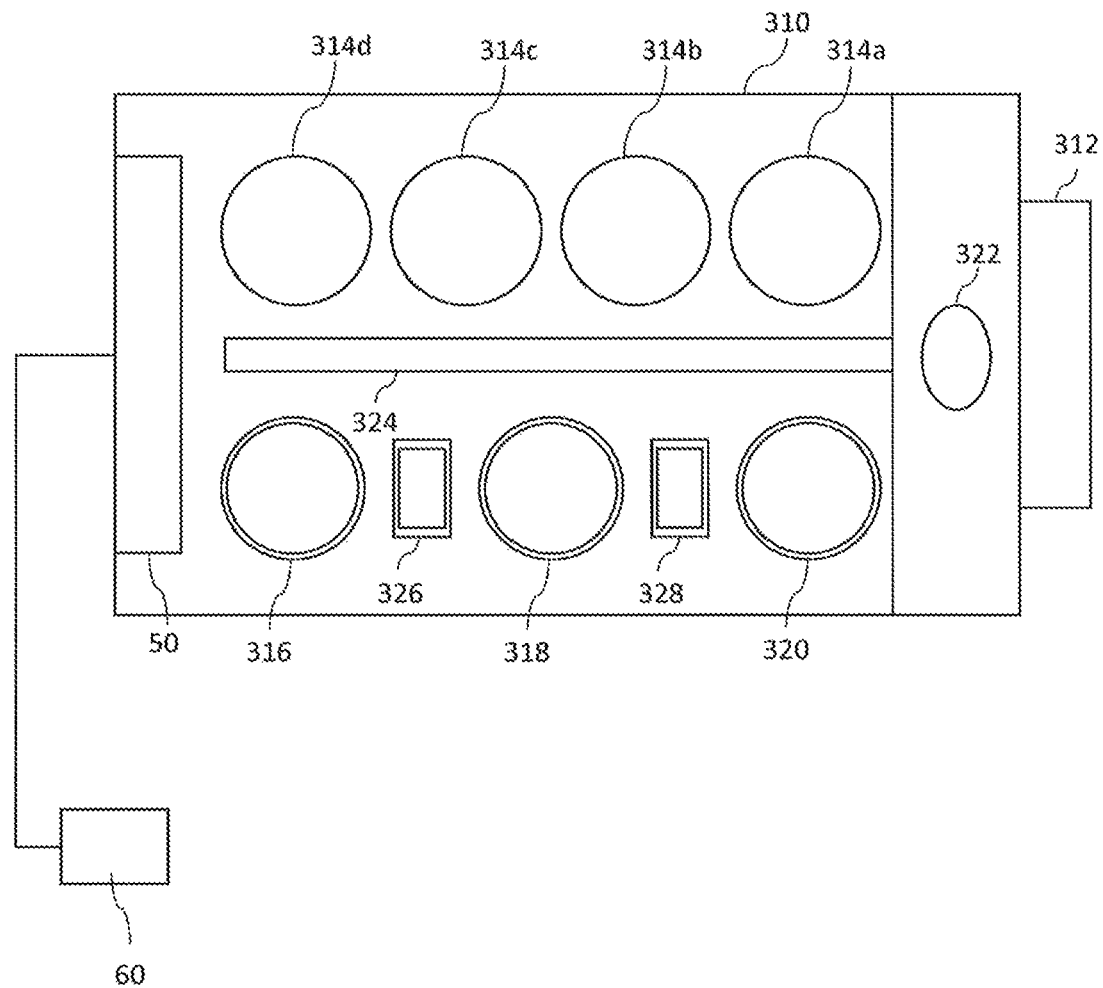
FIG. 1 is an upper plan view showing an overall configuration of the substrate processing device including the substrate cleaning device according to an embodiment of the disclosure.

As shown in FIG. 1, the substrate processing device has a substantially rectangular housing 310 and a load port 312 on which a substrate W cassette for stocking a large number of substrates W is placed. The load port 312 is arranged adjacent to the housing 310. The load port 312 can be equipped with an open cassette, a SMIF (Standard Mechanical Interface) pod or a FOUP (Front Opening Unified Pod). The SMIF pod and the FOUP are closed containers that can maintain an environment independent of the external space by storing the substrate W cassette inside and covering the substrate W cassette with a partition wall. The substrate W can be a semiconductor wafer or the like, for example.

Inside the housing 310, a plurality of polishing units 314a to 314d (four in the aspect shown in FIG. 1), a first cleaning unit 316 and a second cleaning unit 318 for cleaning the polished substrate W, and a drying unit 320 for drying the cleaned substrate W are housed. The polishing units 314a to 314d are arranged along the longitudinal direction of the substrate processing device, and the cleaning units 316 and 318 and the drying unit 320 are also arranged along the longitudinal direction of the substrate processing device. According to the substrate processing device of this embodiment, various substrates W can be polished in the process of manufacturing the magnetic film in a semiconductor wafer with a diameter of 150 mm, 200 mm, 300 mm or 450 mm, a flat panel, an image sensor such as CMOS (Complementary Metal Oxide Semiconductor) and CCD (Charge Coupled Device), and an MRAM (Magnetoresistive Random Access Memory).

A first transfer robot 322 is arranged in the region surrounded by the load port 312, the polishing unit 314a located on the side of the load port 312, and the drying unit 320. Further, a transfer unit 324 is arranged in parallel to the polishing units 314a to 314d, the cleaning units 316 and 318, and the drying unit 320. The first transfer robot 322 receives the substrate W before polishing from the load port 312 and delivers the substrate W to the transfer unit 324, or receives the dried substrate W from the drying unit 320.

A second transfer robot 326 that delivers the substrate W between the first cleaning unit 316 and the second cleaning unit 318 is arranged between the first cleaning unit 316 and the second cleaning unit 318, and a third transfer robot 328 that delivers the substrate W between the second cleaning unit 318 and the drying unit 320 is arranged between the second cleaning unit 318 and the drying unit 320. Further, inside the housing 310, a controller 50 that controls the movement of each device of the substrate processing device is arranged. This embodiment illustrates an aspect in which the controller 50 is arranged inside the housing 310, but the disclosure is not limited thereto, and the controller 50 may be arranged outside the housing 310, or a remote operation from a remote location is possible. Further, the controller 50 may be composed of a plurality of devices, and when the controller 50 is composed of a plurality of devices, the devices constituting the controller 50 may be installed in different rooms or different places, or a part of the controller 50 and the rest of the controller 50 may be arranged in remote locations.

As the first cleaning unit 316, a roll cleaning device may be used, which in the presence of a cleaning liquid, brings a roll cleaning member 11b extending linearly over almost the entire length of the diameter of the substrate W into contact with the surface of the substrate W and scrubs and cleans the surface of the substrate W while rotating the roll cleaning member 11b around a central axis parallel to the substrate W. Further, as the second cleaning unit 318, a pencil cleaning device may be used, which in the presence of the cleaning liquid, brings the lower end contact surface of a cylindrical pencil cleaning member 11a that extends in the vertical direction into contact with the surface of the substrate W and scrubs and cleans the surface of the substrate W by moving the pencil cleaning member 11a in one direction while rotating the pencil cleaning member 11a. Further, as the drying unit 320, a spin drying unit may be used, which dries the substrate W by ejecting IPA steam from a moving injection nozzle toward the horizontally rotating substrate W and further dries the substrate W with a centrifugal force by rotating the substrate W at a high speed.

Nevertheless, the first cleaning unit 316 may not be a roll cleaning device, and a pencil cleaning device similar to the second cleaning unit 318 may be used, or a two-fluid jet cleaning device that cleans the surface of the substrate W with a two-fluid jet may be used. Further, the second cleaning unit 318 may not be a pencil cleaning device, and a roll cleaning device similar to the first cleaning unit 316 may be used, or a two-fluid jet cleaning device that cleans the surface of the substrate W with a two-fluid jet may be used. The aspect of the disclosure can be applied to both the first cleaning unit 316 and the second cleaning unit 318, and can also be used with a roll cleaning device, a pencil cleaning device, and/or a two-fluid jet cleaning device.

The cleaning liquid of this embodiment includes a rinse liquid such as pure water (DIW) and a chemical liquid such as ammonia hydrogen peroxide (SC1), hydrochloric hydrogen preoxide (SC2), sulfuric acid hydrogen peroxide mixture (SPM), sulfuric acid hydrogen peroxide, and hydrofluoric acid. Unless otherwise specified in this embodiment, the cleaning liquid means either a rinse liquid or a chemical liquid.

As shown in FIG. 2, the substrate cleaning device according to the embodiment of the disclosure may include a casing 5, a substrate support mechanism 100 that supports the substrate W in the casing 5, a rotating part 35 that rotates the substrate support mechanism 100, a cleaning part 10 that physically cleans the substrate W supported by the substrate support mechanism 100, and a cleaning liquid supply part 90 that supplies the cleaning liquid. The substrate support mechanism 100 is in an open state when not supporting the substrate W, and is in a closed state when supporting the substrate W. The opening/closing of the substrate support mechanism 100 may be controlled based on a command from the controller 50, and the substrate support mechanism 100 may be automatically set to the closed state by placing the substrate W, and may be automatically set to the open state when the substrate W is removed (when a certain force or more is applied). In the aspect shown in FIG. 2, as an example, the cleaning liquid supply part 90 has a chemical liquid supply nozzle 91 that supplies the chemical liquid, a fluid jet nozzle 92 that supplies two fluids, and a rinse liquid supply nozzle 93 that supplies the rinse liquid. The control of the supply of the cleaning liquid from the cleaning liquid supply part 90 may be performed by the controller 50 reading a recipe stored in a storage part 60. This embodiment illustrates an aspect in which the controller 50 of the substrate processing device controls the substrate cleaning device, but the disclosure is not limited thereto, and the control may be performed by a dedicated controller for controlling the substrate cleaning device.

The cleaning part 10 may have a first cleaning part that supplies the cleaning liquid to one surface of the substrate W, and a second cleaning part that supplies the cleaning liquid to the other surface of the substrate W. The cleaning part 10 shown in FIG. 2 is the first cleaning part, and FIG. 2 does not show the second cleaning part.

Figure 13:
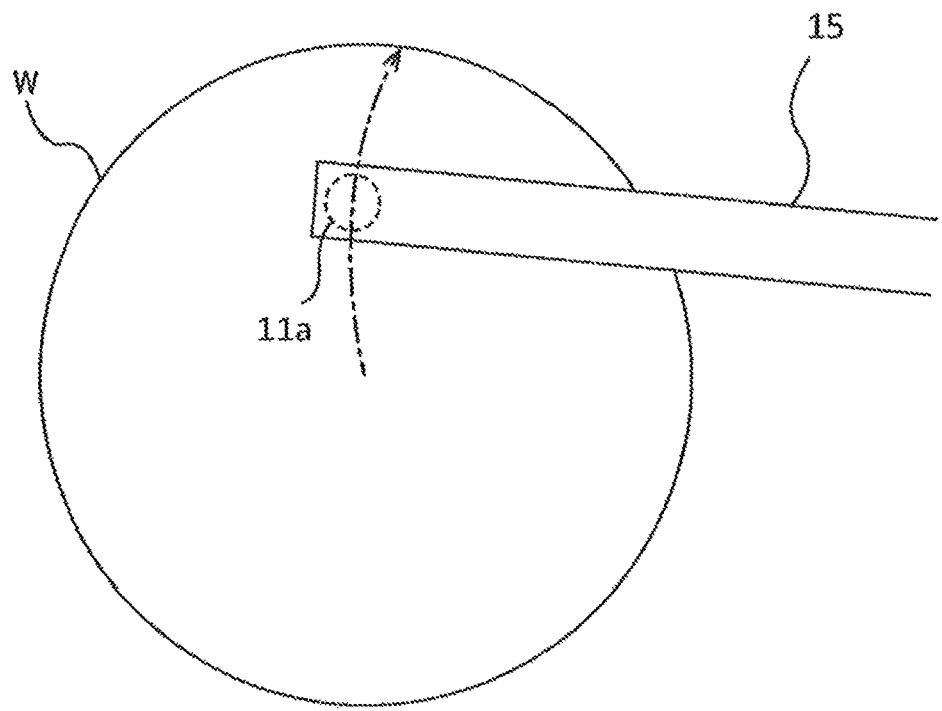
FIG. 13 is an upper plan view showing the pencil cleaning member used in an embodiment of the disclosure.
Figure 14:
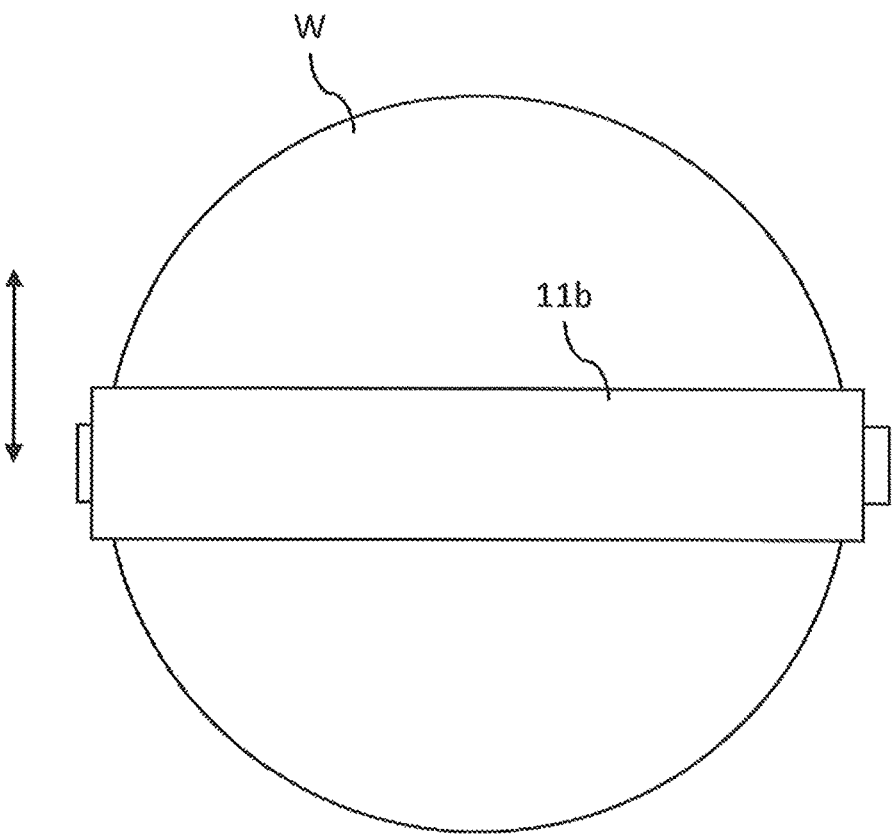
FIG. 14 is an upper plan view showing the roll cleaning member used in an embodiment of the disclosure.

A cleaning member 11 including the roll cleaning member 11b and/or the pencil cleaning member 11a that comes into contact with the substrate W for cleaning the substrate W may be provided (see FIG. 13 and FIG. 14). The cleaning member 11 may include the first cleaning member 11 that is a component of the first cleaning part and contacts and cleans one surface of the substrate W, and the second cleaning member 11 that is a component of the second cleaning part and contacts and cleans the other surface of the substrate W.

As shown in FIG. 2, the substrate support mechanism 100 may include a first support part 110 that is swingable and has a contact region capable of contacting the peripheral edge of one surface of the substrate W in the closed state, a second support part 120 that supports the other surface of the substrate W, and a first support part moving part 140 that swings the first support part 110.

Figure 15:
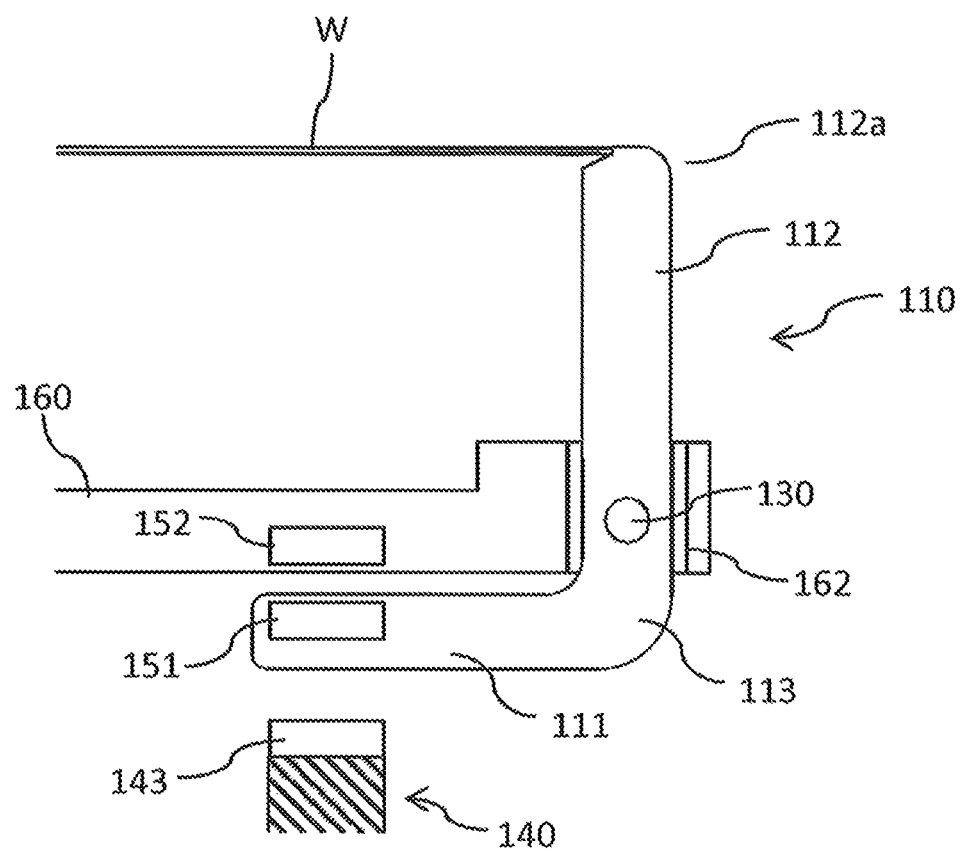
FIG. 15 is a side view showing an aspect in which the second support part is not provided in an embodiment of the disclosure.

The first support part 110 may have a contact region that contacts only one surface or one surface and the side surface of the substrate W, and may be configured not to contact the other surface of the substrate W. One surface of the substrate W is, for example, the upper surface of a bevel portion Wb (which will be described later) of a wafer. However, the disclosure is not limited to such an aspect, and the first support part 110 may be configured to contact the other surface of the substrate W. Further, when the first support part 110 comes into contact with the other surface of the substrate W, the second support part 120 may not be provided (see FIG. 15).

Figure 3:
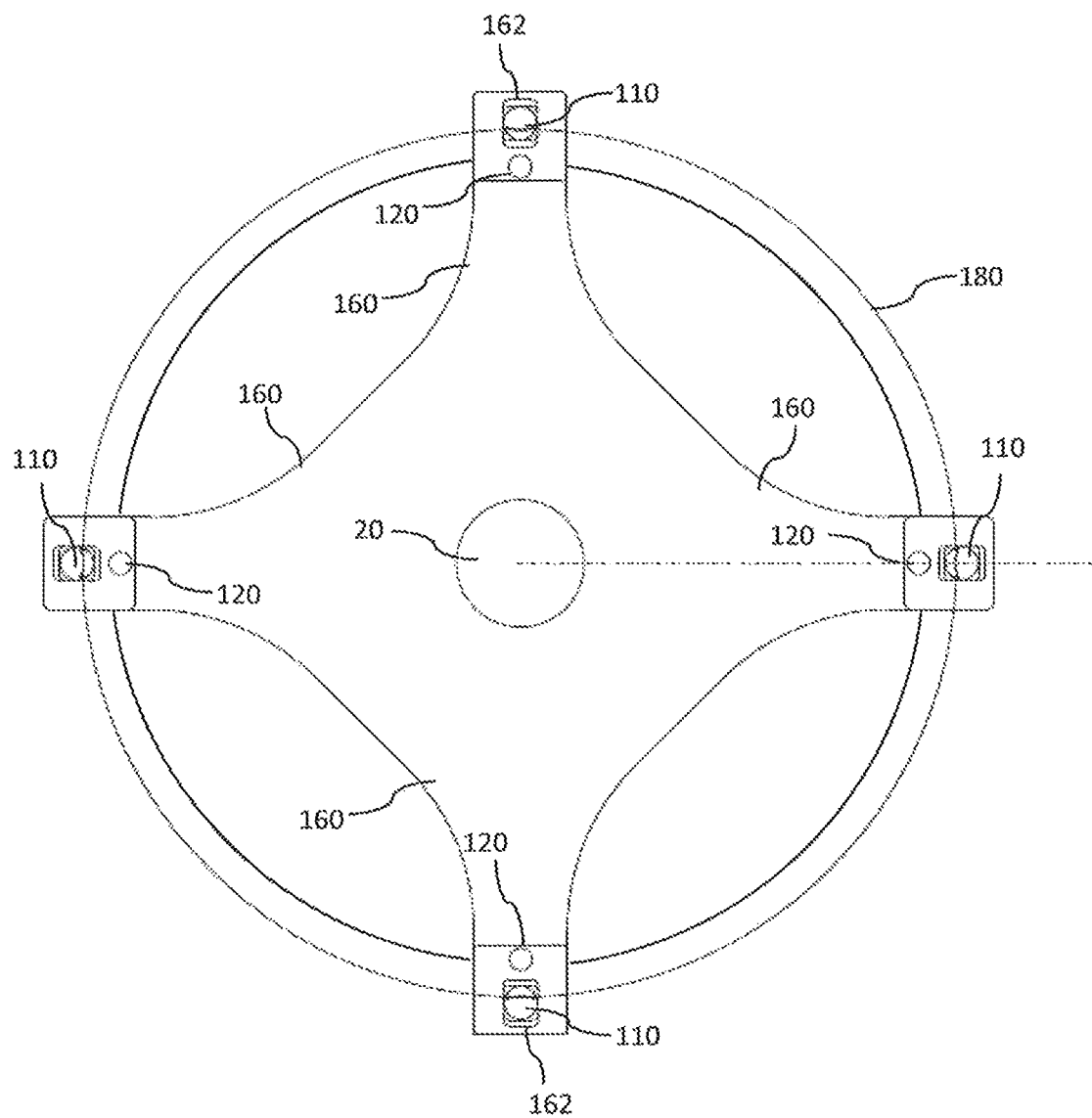
FIG. 3 is an upper plan view showing the arm part, etc. used in the first embodiment of the disclosure.

The second support part 120 may be provided on a straight line connecting the first support part 110 and the rotation center of a rotated part 20 (see FIG. 3). In this case, the second support part 120 is provided on a straight line connecting the contact region and the center point of the substrate W in the in-plane direction. When such an aspect is adopted, for example, the second support part 120 may be provided on each of the extending (for example, four) arm parts 160, which is useful in that the configuration can be simplified. As shown in FIG. 2, the rotating part 35 includes a motor 36, a first rotating portion 31 which is rotated by the motor 36, and a second rotating portion 32 which is connected to the first rotating portion 31 via a belt 37 and rotates together with the first rotating portion 31.

Figure 6:
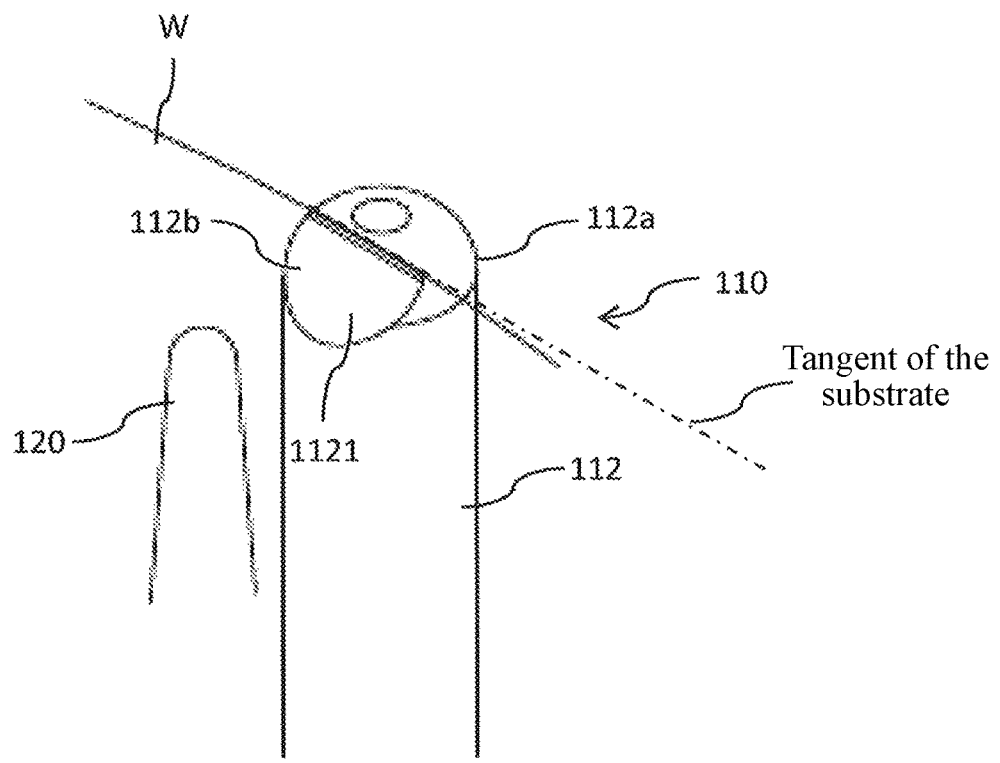
FIG. 6 is a perspective view of the substrate support mechanism according to the first embodiment of the disclosure.
Figure 9:
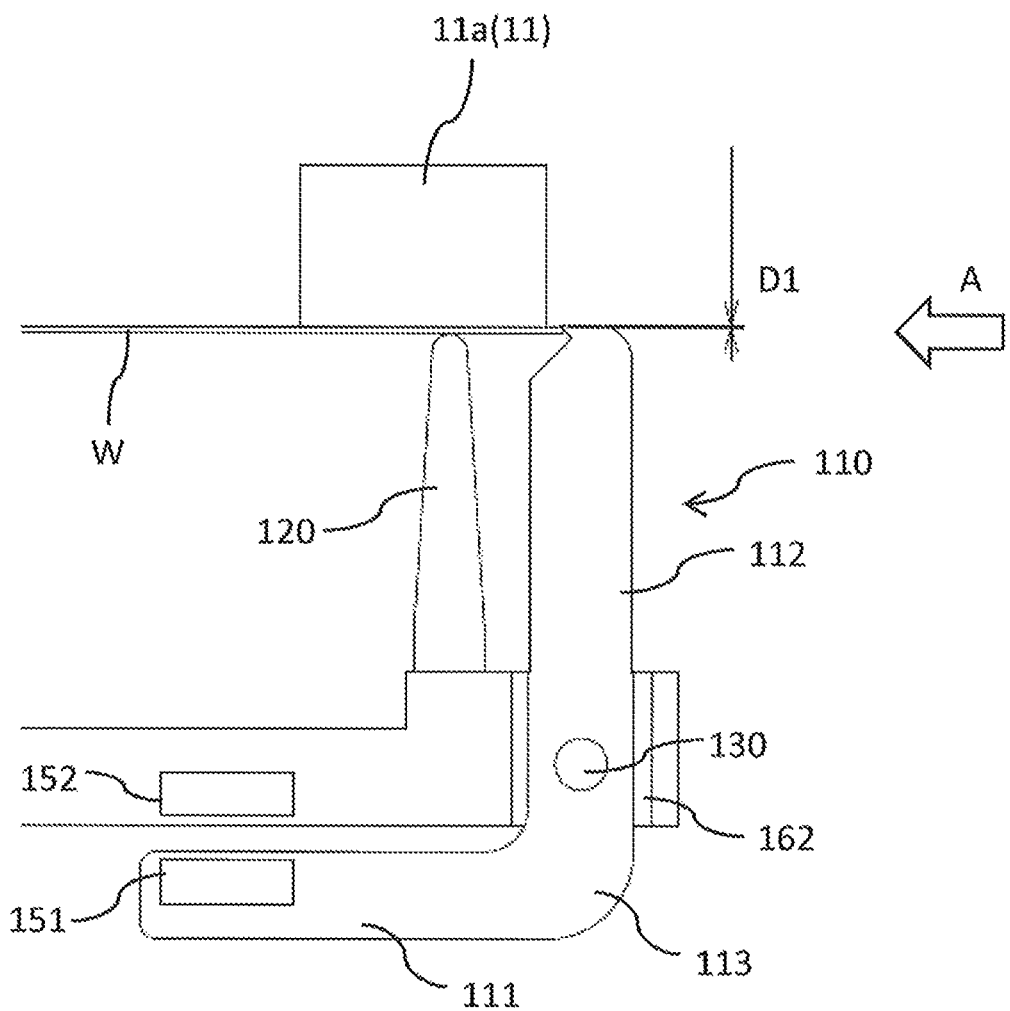
FIG. 9 is a side view showing the first support part, the second support part, and the cleaning member according to the first embodiment of the disclosure.
Figure 10:
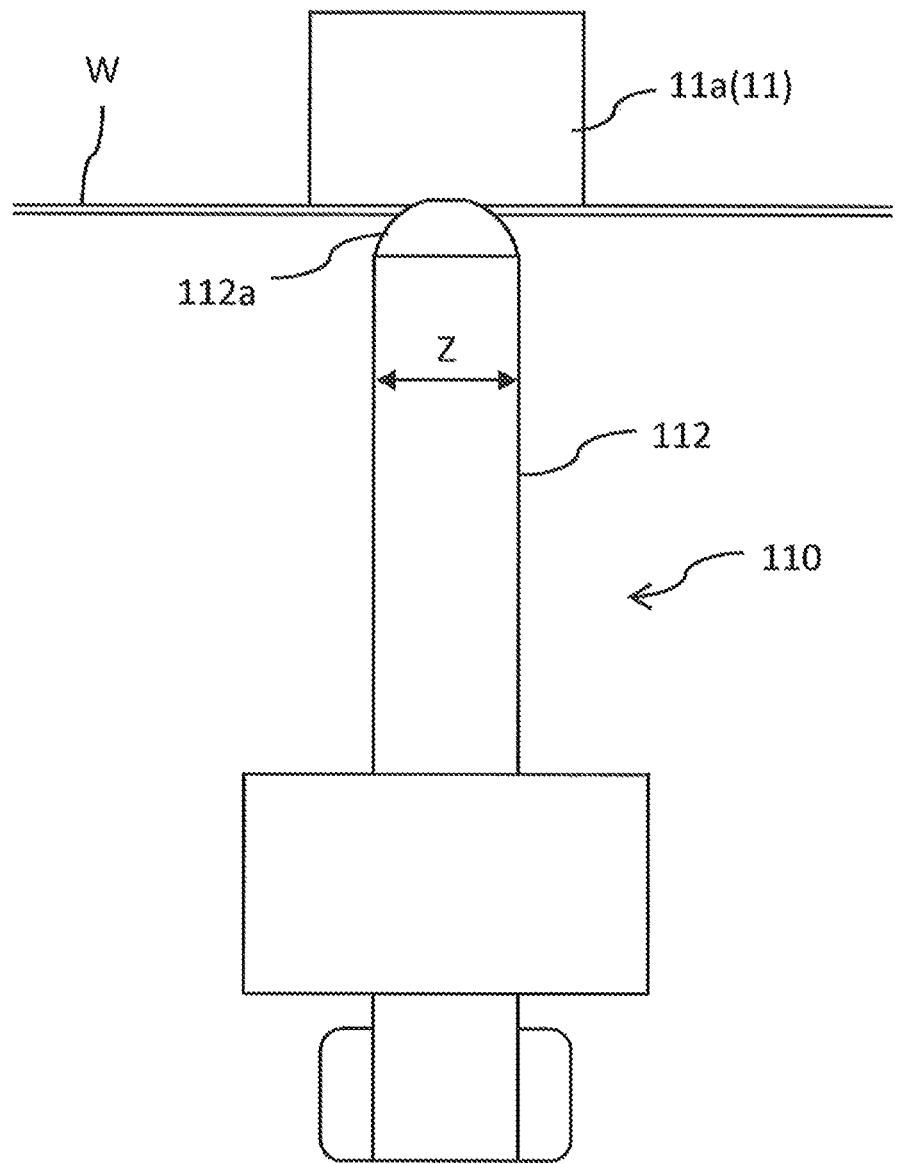
FIG. 10 is a view of the first support part and the cleaning member according to the first embodiment of the disclosure as viewed from the direction of the arrow A in FIG. 9.

The tip portion 112a of the first support part 110 may be continuously narrowed in width or may be intermittently narrowed in width. In FIG. 10, the tip portion 112a of the first support part 110 has a R-shape and forms a semicircular shape in a vertical cross section that includes the center of the top of the tip portion 112a of the first support part 110 in the in-plane direction and that is cut in a plane including the first direction and a direction in which the tangent (see FIG. 6) of the substrate W at the center position in the width direction of the first support part 110 extends (the third direction in FIG. 2). In FIG. 10, the pencil cleaning member 11a is moved to the front surface side of the paper surface. The degree of opening in the open state may be small, and the tip portion 112a of the first support part 110 in the open state may be opened only about 1 mm to 2 mm as compared with the closed state (see the degree of opening in the left-right direction in FIG. 9). If the degree of opening is small as described above, it is conceivable that the tip portion 112a of the first support part 110 is caught by the substrate W when the substrate W is taken out. However, even if such a situation occurs, the tip portion 112a of the first support part 110 may still be opened and released by the force of pulling up the substrate W.

Figure 7:
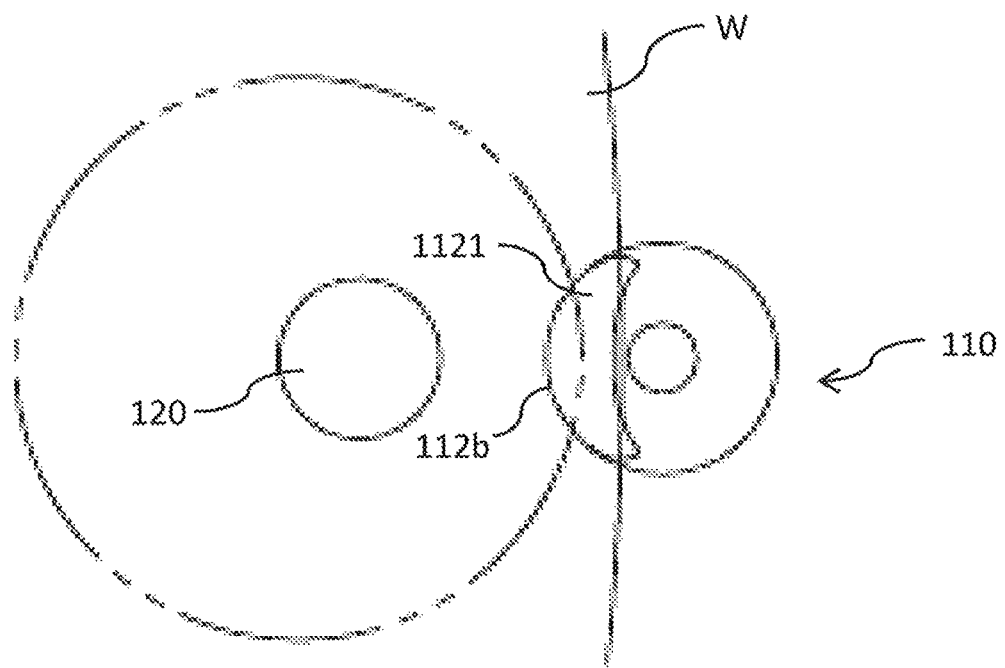
FIG. 7 is an upper plan view of the substrate support mechanism according to the first embodiment of the disclosure.

The tip portion 112a of the first support part 110 may be inclined and protrude toward the inside of the peripheral edge (see FIG. 8), or may intermittently protrude toward the inside of the peripheral edge. In this embodiment, the "tip portion 112a" of the first support part 110 includes at least a region located on one side with respect to one surface of the substrate W, and typically means a region of about 1 mm from one side end portion of the first support part 110. The inner peripheral side surface near the tip portion 112a of the first support part 110 may have a notch part 112b. The notch part 112b may have a first inclined portion 1121 that is continuously inclined in the outer peripheral direction toward one side, and a second inclined portion 1122 that is continuously inclined in the inner peripheral direction from the first inclined portion 1121 toward one side (see FIG. 6 to FIG. 8). In the closed state of the first support part 110, the inner peripheral surface of the second inclined portion 1122 is in contact with one surface or one surface and the side surface of the substrate. The "peripheral edge of the substrate W" in this embodiment means a region within 5% of the radius of the substrate from the outer edge E (position on the outermost peripheral side) of the substrate W when the substrate W has a circular shape like a wafer. In this embodiment, the "side surface" means a surface extending in a direction matching the thickness direction (first direction) of the substrate W, and constitutes one surface or the other surface if it deviates from the direction (first direction) even a little. In the aspect shown in FIG. 8, the portion having a substantially arc shape in the vertical cross section is the bevel portion Wb, and the surface on one side of the center of the substrate W in the thickness direction becomes one surface and the surface on the other side of the center of the substrate W in the thickness direction becomes the other surface at the portion inclined with respect to the first direction also in this bevel portion Wb. The bevel portion Wb has various shapes, and can adopt any conventionally used shape (including a polygonal shape). As described above, the vertical cross section may be in an arc shape or a rectangular shape as shown in Japanese Patent Laid-Open No. 2010-162624, or the vertical cross section may be close to a triangular shape. The contact length between the substrate W and the first support part 110 may be 20% to 100% with respect to the width Z (see FIG. 10) of the first support part 110.

Figure 8:
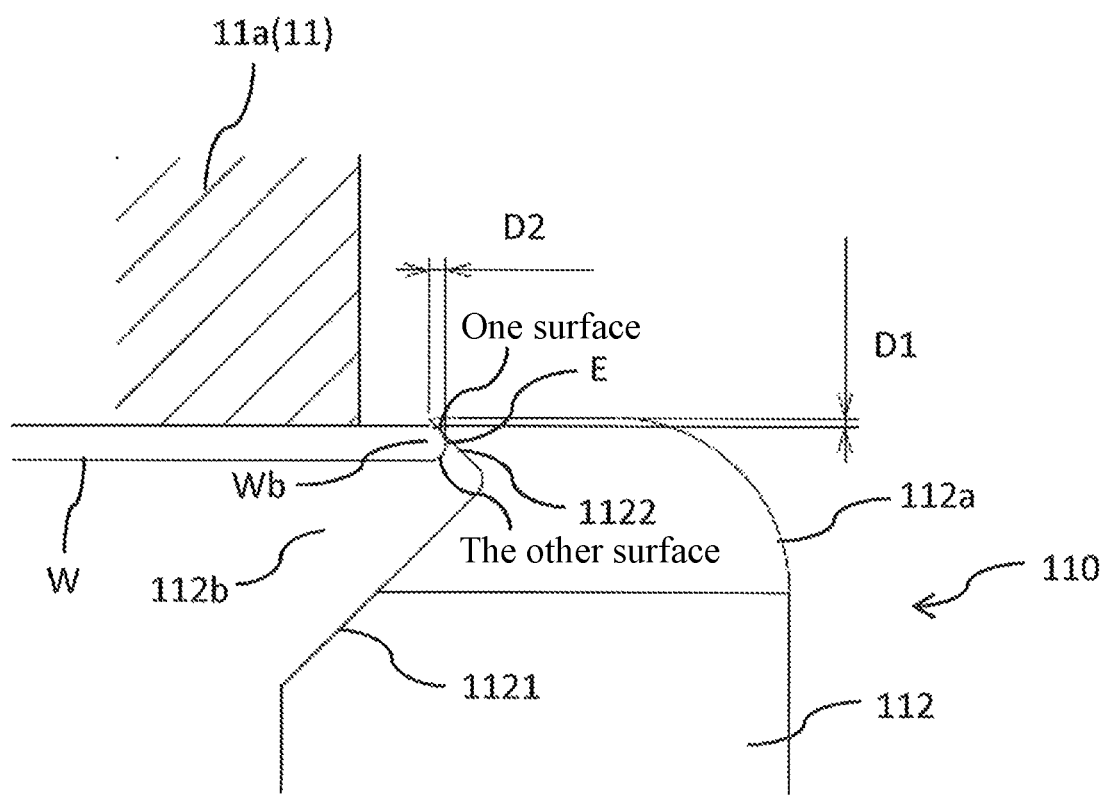
FIG. 8 is an enlarged side view showing the first support part according to the first embodiment of the disclosure.

The apex or top surface of the tip portion 112a of the first support part 110 may be located on one side of the substrate W at a position of 0.5 mm or less from one surface of the substrate W, and hardly protrude to one surface side of the substrate W. In the conventional aspect, the apex or top surface of the tip portion 112a of the first support part 110 generally protrudes by about 1.0 mm from one surface of the substrate W. Therefore, in the aspect of this embodiment, the protrusion amount thereof is significantly reduced. D1 in FIG. 8 and FIG. 9 is the amount of the tip portion 112a of the first support part 110 protruding from one surface of the substrate W, but the D1 may be 0.5 mm or less. The apex or top surface of the tip portion 112a of the first support part 110 may be located on one side of the substrate W at a position of 0.4 mm or less, or 0.3 mm or less if more limited, from one side end portion of one surface of the substrate W. The lower limit may be 0.1 mm. However, considering the case where the tip portion 112a contacts only the bevel portion Wb, the apex or top surface of the tip portion 112a of the first support part 110 may be located on the other side of one side end portion of one surface of the substrate W (D1 in FIG. 8 may be negative). When the width of the first support part 110 along the rotation direction of the substrate W is narrow, the tip portion 112a of the first support part 110 becomes an apex, and when the tip portion 112a of the first support part 110 is large to some extent, the tip portion 112a of the first support part 110 becomes a top surface. The top surface may be a flat surface.

In the closed state, the tip portion 112a of the first support part 110 overlaps with the substrate W in the in-plane direction, but the amount thereof may be small. The amount of overlap in the in-plane direction between the tip portion 112a of the first support part 110 and the substrate W is shown as D2 in FIG. 8, but the D2 may be, for example, 0.7 mm or less, 0.5 mm or less if more limited, and 0.4 mm or less if further limited. The lower limit may be 0.1 mm.

The swing of the first support part 110 may be realized by a magnetic force. However, the disclosure is not limited to such an aspect, and the first support part 110 may be swung by applying a physical force by contact. The conventional grip part may be adopted as the substrate support mechanism 100.

As shown in FIG. 9, the first support part 110 may include a first extending portion 111 extending along the in-plane direction of the substrate W, a second extending portion 112 extending to one side from the first extending portion 111, and a bending portion 113 provided between the first extending portion 111 and the second extending portion 112. The tip portion of the second extending portion 112 becomes the tip portion 112a of the first support part 110 described above, and is provided with the contact region described above. On the other hand, the end portion of the second extending portion 112 becomes the base end portion of the first support part 110. The first extending portion 111 may be located on the other surface side of the substrate W, and extend linearly from the rotation center of the rotated part 20 toward the outside of the peripheral edge on the other surface side of the substrate W.

A plurality of arm parts 160 extending from the rotation center of the rotated part 20 toward the outside of the peripheral edge in the in-plane direction may be provided on the other surface side of the substrate W. In the aspect shown in FIG. 3, four arm parts 160 are provided.

Figure 4A:
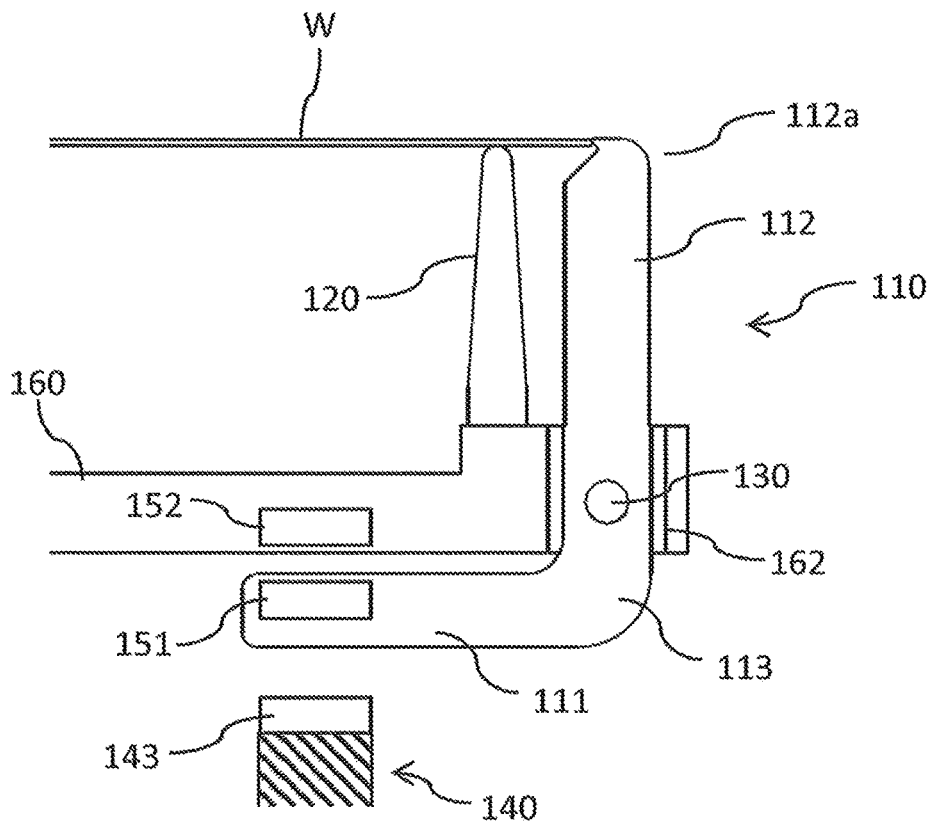
FIG. 4A is a side view showing the substrate support mechanism (closed state) used as one aspect of the first embodiment of the disclosure.
Figure 4B:
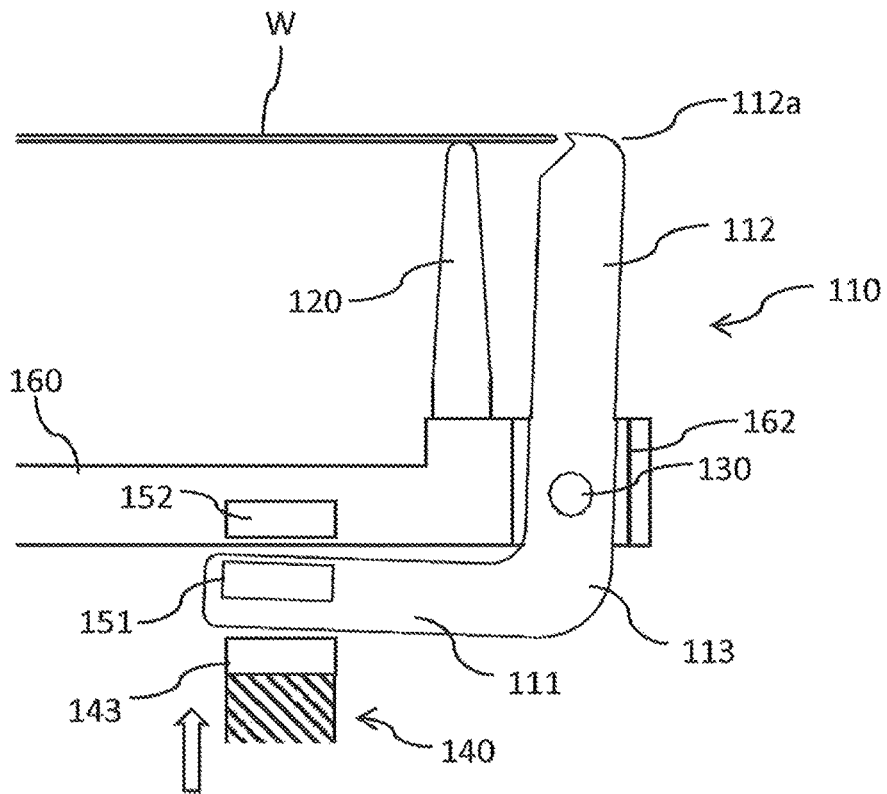
FIG. 4B is a side view showing the substrate support mechanism (open state) used as one aspect of the first embodiment of the disclosure.

As shown in FIG. 4A and FIG. 4B, a first magnet 151 may be provided on the first extending portion 111. Further, a second magnet 152 may be provided between the substrate W and the first extending portion 111 at a position facing the first magnet 151. As an example, the second magnet 152 may be provided inside the arm part 160 described above. A repulsive force between the first magnet 151 and the second magnet 152 may apply a swinging force toward the inner side of the peripheral edge of the contact region. Specifically, the base end portion of the first extending portion 111 receives a downward force due to the force of the first magnet 151 moving away from the second magnet 152, and as a result, the tip portion 112a of the second extending portion 112 receives a force toward the inside of the peripheral edge. At this time, a swing shaft 130 may be provided on any of the first extending portion 111, the second extending portion 112, and the bending portion 113. The first magnet 151, the second magnet 152, and a third magnet 143 which will be described later can have a diameter of about 10 mm to 20 mm, and a thickness of about 3 mm to 7 mm. The gripping force (supporting force) of the first support part 110 realized by the repulsive force between the first magnet 151 and the second magnet 152 is about 5N to 15N, preferably 8N or more.

Only one set of the first magnet 151 and the second magnet 152 that form a pair may be provided, but a plurality of sets may also be provided. As an example, the same number of the arm parts 160 and the first support parts 110 may be provided. In this case, the second magnet 152 may be provided in each arm part 160, the first magnet 151 may be provided in each first support part 110, and the second magnets 152 and the first magnets 151 may be provided in pairs. Each first support part 110 may be fixed to each arm part 160, and the support part may be rotated by the rotating part 35 as the rotating part 35 is rotated. In the aspect shown in FIG. 4A and FIG. 4B, the first support part 110 is swingably fixed to the arm part 160 via the swing shaft 130. More specifically, the second extending portion 112 of the first support part 110 is provided so as to pass through a through hole 162 provided in the arm part 160, and in the through hole 162, the first support part 110 is swingably fixed to the arm part 160 via the swing shaft 130. If the swing shaft 130 is provided in the through hole 162 and the distance from the substrate W in the normal direction of the substrate W is long, the tip portion 112a of the first support part 110 can be swung with a long radius, and the movement can be made close to the movement along the in-plane direction of the substrate W (for example, the movement in the horizontal direction). Therefore, it is possible to secure the gripping of the substrate W while reducing the protrusion amount to one side of the substrate W. Further, when such an aspect is adopted, it is also advantageous in that the plurality of first support parts 110 are less likely to be displaced in the height direction.

The first magnet 151 and the second magnet 152 may rotate together with the substrate W when the substrate W rotates. In the aspect shown in FIG. 4A and FIG. 4B, since the arm part 160 is rotated by the rotating part 35, the second magnet 152 provided in the arm part 160 and the first magnet 151 swingably fixed to the arm part 160 are rotated together with the arm part 160.

The second support part 120 may be provided on the arm part 160. In the aspect shown in FIG. 4A and FIG. 4B, the second support part 120 is provided on one surface of the arm part 160, and the second support part 120 extends linearly along the first direction. The same number of the arm parts 160 and the second support parts 120 may be provided, and the second support part 120 may be provided on each arm part 160. The apex or top surface of the second support part 120 contacts the other surface (back surface) of the substrate W. The first support part 110 and the second support part 120 may correspond to each other in a one-to-one manner, and the same number of the first support parts 110 and the second support parts 120 may be provided, but the disclosure is not limited to such an aspect, and the number of the first support parts 110 and the number of the second support parts 120 may be different from each other.

Figure 5A:
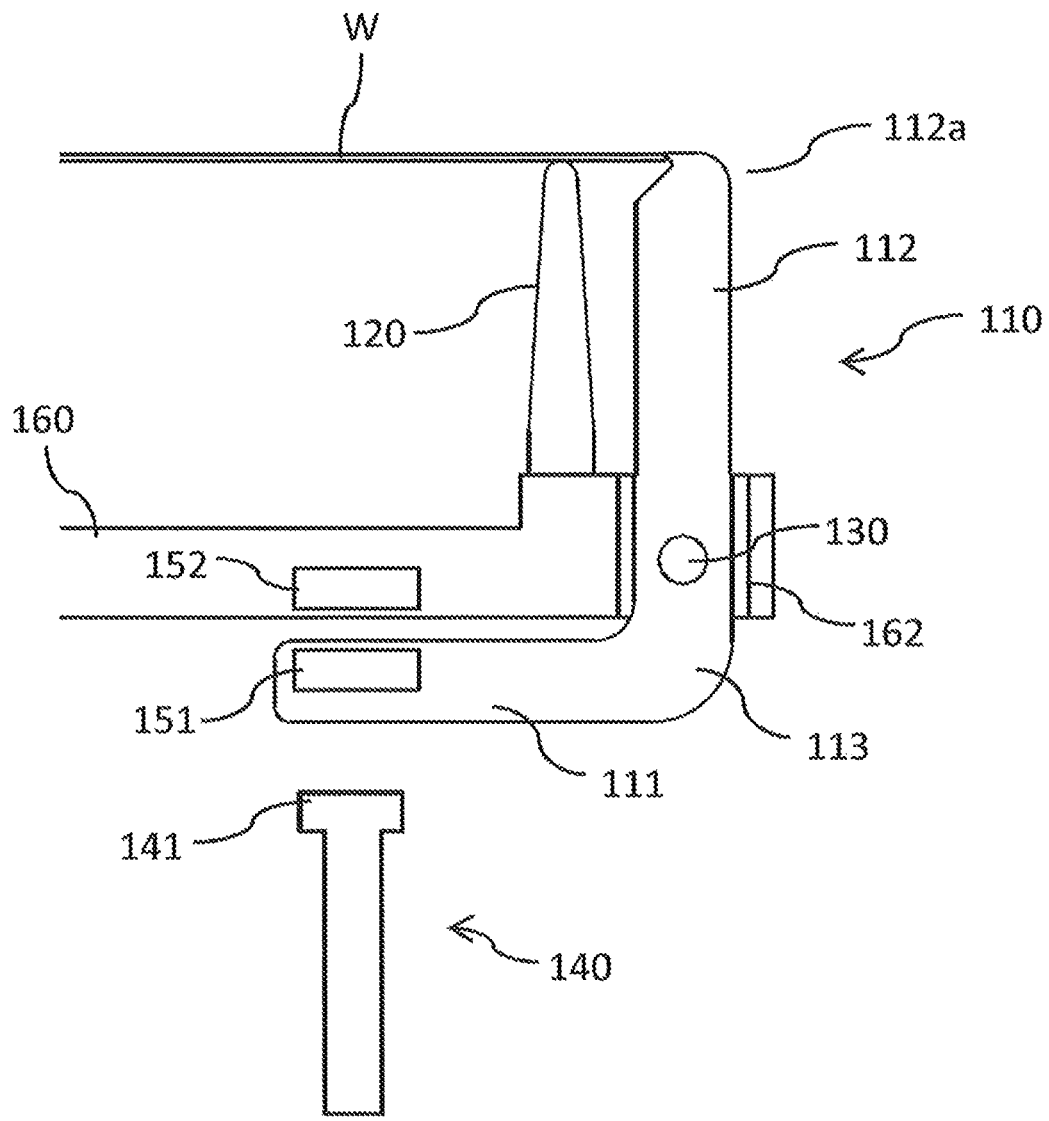
FIG. 5A is a side view showing the substrate support mechanism (closed state) used as another aspect of the first embodiment of the disclosure.
Figure 5B:
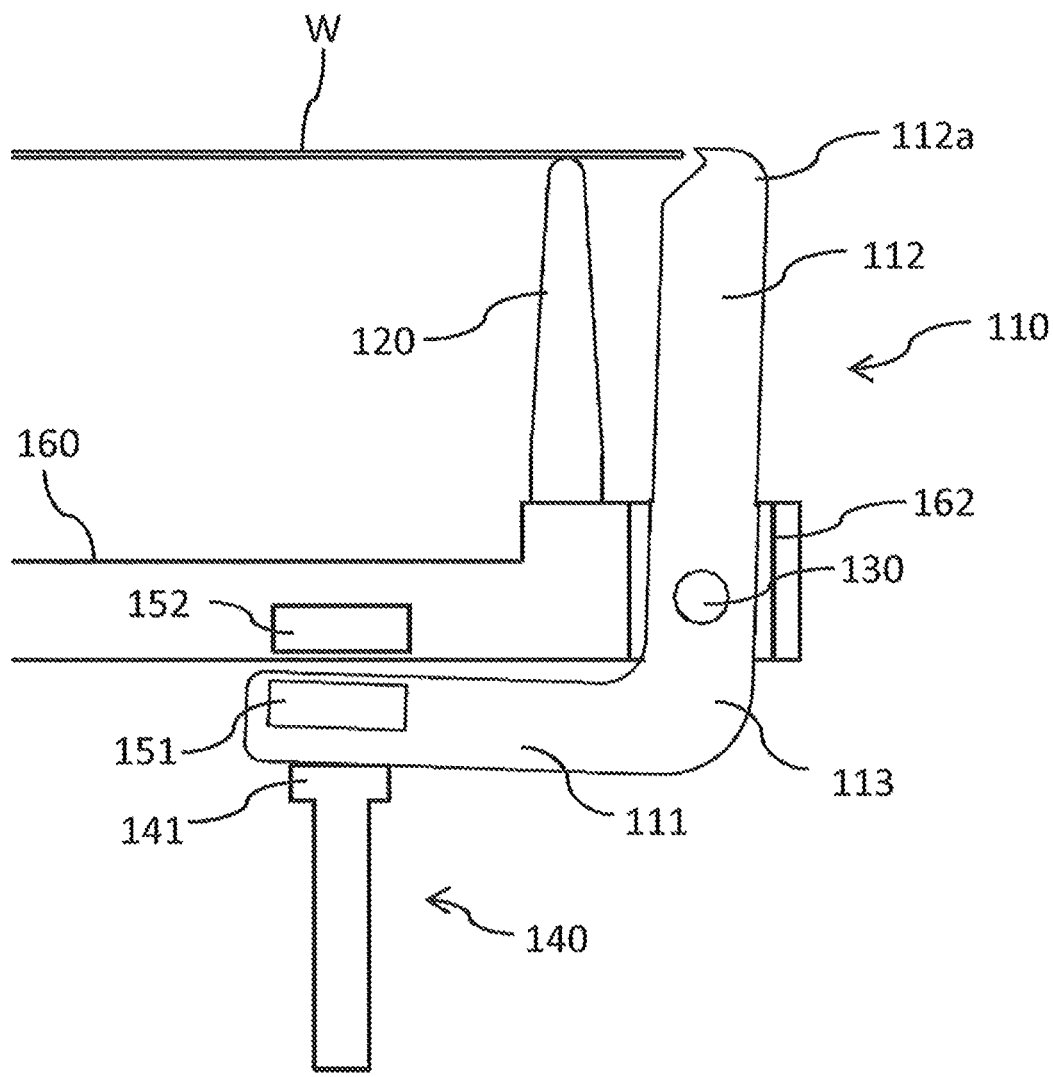
FIG. 5B is a side view showing the substrate support mechanism (open state) used as another aspect of the first embodiment of the disclosure.

The first support part moving part 140 may be located on the other side of the first extending portion 111, and by moving the first extending portion 111 to one side, move the tip portion 112a of the second extending portion 112 to the outside of the peripheral edge. For example, a contact portion 141 of the first support part moving part 140 may contact the other surface of the first extending portion 111 to move the first extending portion 111 to one side (see FIG. 5A and FIG. 5B). Further, a third magnet 143 may be provided in the first support part moving part 140, and the first magnet 151 may receive a repulsive force due to the magnetic force from the third magnet 143 to the first extending portion 111 to one side (see FIG. 4A and FIG. 4B). The same number of the first support part moving parts 140 as the arms may be provided. Then, each first support part moving part 140 may be provided corresponding to each arm part 160. However, the disclosure is not limited to such an aspect, and fewer (typically one) first support part moving parts 140 than the arm parts 160 may be provided, or the first support part moving part 140 may be continuously provided in a circumferential shape in the plan view, and the first support part moving part 140 may move to one side so as to move the plurality of first extending portions 111 to one side at the same time.

A moved part 180 may be provided on the other surface side of the arm part 160, and a moving part 170 for moving the moved part 180 along the first direction may be provided. In the aspect shown in FIG. 2, the moving part 170 composed of an actuator or the like is provided on the other surface of the moved part 180, and the moved part 180 can be moved along the first direction by the moving part 170. The moved part 180 has, for example, a ring shape and may be composed of an unclamped ring.

When the substrate W is rotated, the plurality of first support parts 110 may be set to the open state randomly or in order. Further, when the substrate W is rotated, the supporting forces of the plurality of first support parts 110 may change randomly or in order. As an example, only one non-rotating first support part moving part 140 provided with the third magnet 143 may move to one side, and when the rotating first extending portion 111 passes through one side of the first support part moving part 140, the first extending portion 111 may move to one side so that the tip portion 112a of the second extending portion 112 is set to the open state or the supporting force of the tip portion 112a of the second extending portion 112 for the substrate W is weakened. However, the disclosure is not limited to such an aspect. The first support part moving part 140 may be provided corresponding to each arm part 160 (thus rotated together with the arm part 160) and the first support part moving parts 140 may move to one side randomly or in a fixed order in response to a command from the controller 50, and as a result, the supporting force of the tip portion 112a of the second extending portion 112 for the substrate W is weakened.

In order to match the position of the third magnet 143 in the in-plane direction with the position of the first magnet 151 in the in-plane direction when the rotation is stopped, the rotation stop position of the first magnet 151 in the in-plane direction may be detected. At this time, the position control performed by a servo motor may be used.

When four or more first support parts 110 are provided, at a certain time, three or more first support parts 110 may support the substrate W, but the remaining first support parts 110 may not support the substrate W. Further, at a certain time, the supporting forces of three first support parts 110 may be equal to or greater than a threshold value, and the supporting forces of the remaining first support parts 110 may be less than the threshold value. In the example in which only one non-rotating first support part moving part 140 provided with the third magnet 143 moves to one side, and when the rotating first extending portion 111 passes through one side of the first support part moving part 140, the first extending portion 111 moves to one side, as described above, the first support part 110 having the first extending portion 111 as a component is set to the open state or the supporting force for the substrate W is set to be less than the threshold value by moving the first extending portion 111 to one side, and the support for the substrate W provided by the other first support parts 110 is continuously performed and the supporting forces thereof are equal to or greater than the threshold value. Further, in the example in which the first support part moving part 140 is provided corresponding to each arm and the first support part moving parts 140 move to one side randomly or in a fixed order in response to a command from the controller 50, the first support part 110 having the first extending portion 111, which corresponds to the first support part moving part 140 moved to one side, as a component is set to the open state or the supporting force of the first support part 110 for the substrate W is set to be less than the threshold value in response to a command from the controller 50, and the support for the substrate W provided by the other first support parts 110 is continuously performed and the supporting forces thereof are equal to or greater than the threshold value.

As shown in FIG. 3, in this embodiment, four substrate support mechanisms 100 may be evenly arranged (at an angle of 90° around the rotation center). The number of the substrate support mechanisms 100 may be three, for example, as long as the substrate W can be stably supported. FIG. 2 shows an example in which the substrate W is supported in the horizontal direction, but the disclosure is not limited thereto. For example, the substrate W may be supported in the longitudinal direction (vertical direction), or the substrate W may be supported to be inclined in the horizontal direction.

[Method]

An example of a method for cleaning the substrate W (a substrate processing method) using the substrate cleaning device of this embodiment is described as follows. Since it overlaps with the above, only a brief description will be given, but all the aspects described in the above "configuration" can be applied to the "method." All the aspects described in the "method" can also be applied to the "configuration." Furthermore, the method of this embodiment may be implemented by the substrate processing device by recording a program for implementing the method of this embodiment on a recording medium such as a USB and reading this recording medium with a computer (not shown). The recording medium may be a non-transitory tangible computer-readable recording medium.

First, the substrate W conveyed into the casing 5 by the transfer unit 324 or the second transfer robot 326 is supported by the substrate support mechanism 100. At this time, the cleaning part 10 is positioned at the standby position.

At this time, the first support part moving part 140 is located on one side, and as a result, the first support part 110 is in the open state. Then, the second support part 120 comes into contact with the other surface of the substrate W, and then the first support part moving part 140 moves to the other side to set the first support part 110 to the closed state, and the substrate W is supported by the substrate support mechanism 100.

Next, the rotated part 20 is rotated by the motor 36 or the like of the rotating part 35, and as a result, the substrate W supported by the substrate support mechanism 100 is rotated.

While the substrate W is being rotated, the chemical liquid is supplied to one surface of the substrate W from the chemical liquid supply nozzle 91. While the chemical liquid is being supplied in this way, one surface of the substrate W is pressed with a predetermined pressing force by a pressing means of a cleaning member (not shown) and physically cleaned (scrub cleaning) by the cleaning member 11 such as the roll cleaning member 11b or the pencil cleaning member 11a that is rotated at a predetermined rotation speed by a rotating means of the cleaning member (not shown) (a rinse liquid such as pure water may be supplied from the rinse liquid supply nozzle 93 instead of the chemical liquid). As an example, when the pencil cleaning member 11a is used, as shown in FIG. 13 for example, an arm 15 which is an example of the swing part (cleaning member swing part) is swung around the swing shaft (not shown). The pencil cleaning member 11a is swung to the outside of the peripheral edge of the substrate W by the arm 15. At this time, the pencil cleaning member 11a may be swung to the outside of the peripheral edge of the substrate W without being stopped in front of the first support part 110. In the present application, "the cleaning member 11 is swung to the outside of the peripheral edge of the substrate W" means that at least a part of the cleaning member 11 is swung to the outside with respect to the peripheral edge of the substrate W.

While the substrate W is being cleaned in this way, only one non-rotating first support part moving part 140 provided with the third magnet 143 may move to one side, and the first support part 110 passing through one side of the third magnet 143 may be set to the open state or the supporting force of the first support part 110 for the substrate W may be less than the threshold value.

When the cleaning performed by the pencil cleaning member 11*a* is completed, the pencil cleaning member 11*a* is separated from the substrate W. Then, at the same time as or immediately before the supply of the chemical liquid is stopped, the fluid jet nozzle 92 is positioned close to the substrate W, and two fluids are injected from the fluid jet nozzle 92 to one surface of the substrate W. The two-fluid nozzle can be an external mixing type nozzle that mixes a liquid and a gas outside the casing of the two-fluid nozzle to form liquid droplets. Alternatively, it is also possible to use an internal mixing type nozzle that mixes a liquid and a gas inside the nozzle to form liquid droplets as the two-fluid nozzle instead.

While the two fluids are being injected in this way, the fluid jet nozzle 92 is mounted on an arm similar to the arm 15, on which the pencil cleaning member 11*a* is mounted, and swung around a swing shaft, and the fluid jet nozzle 92 passes through the center of the substrate W and is moved to the outer periphery of the substrate W.

The chemical liquid is supplied from the chemical liquid supply nozzle 91 to one surface of the substrate W at the same time as or immediately before the two-fluid jet cleaning is stopped.

Next, the rinse liquid is supplied from the rinse liquid supply nozzle 93 to one surface of the substrate W. After a time required for the rinse liquid to reach the substrate W or a sufficient time has elapsed, the supply of the chemical liquid from the chemical liquid supply nozzle 91 is stopped. A pre-measured time may be used to determine whether the time required for the rinse liquid to reach the substrate W has elapsed. In this case, for example, the controller 50 may read a recipe stored in the storage part 60 to stop the supply of the chemical liquid at a scheduled timing.

After one surface of the substrate W is cleaned with the rinse liquid for a predetermined time, the rotation of the substrate W is stopped. More specifically, the rotation of the rotated part 20 caused by the rotating part 35 is stopped, and as a result, the rotation of the substrate W supported by the substrate support mechanism 100 is stopped.

The substrate W is taken out from the casing 5 by the second transfer robot 326 or the third transfer robot 328 in a wet state. When the substrate W is taken out in this way, the first support part moving part 140 is located on one side, and as a result, the first support part 110 is in the open state.

When it comes to the finish cleaning and the substrate W is being cleaned by the second cleaning unit 318, the substrate W may be taken out from the casing 5 and conveyed into the drying unit 320 by the third transfer robot 328. Then, when the substrate W is conveyed into the drying unit 320 in this way, the substrate W is dried by the drying unit 320.

After cleaning with rinse, the supply of the rinse liquid from the rinse liquid supply nozzle 93 is stopped, and the substrate W supported by the substrate support mechanism 100 may be rotated at a high speed to shake off and dry the rinse liquid.

The above illustrates an aspect of cleaning only one surface of the substrate W, but the disclosure is not limited to such an aspect, and an aspect of simultaneously cleaning both one surface and the other surface of the substrate W may be adopted. In this case, the pencil cleaning member 11*a* may be positioned between the arm part 160 and the back surface of the substrate W. Further, as shown in Japanese Patent Laid-Open No. 2019-003977, the rotating part for rotating the rotated part may be provided outside the peripheral edge of the rotated part. More specifically, the rotating part may be a stator, the rotated part may be a rotor, and the rotated part may be rotated in a non-contact state by a magnetic force. In this case, the rotated part may have a magnet, and the rotating part may have a coil or a coil and a magnet. In this case, the rotating part and the rotated part constitute a so-called bearingless motor that can rotate the rotated part while controlling its position in the in-plane direction in a non-contact manner without supporting the rotated part with a bearing.

Further, the above illustrates an example of using the pencil cleaning member 11*a* as the cleaning member 11, but the disclosure is not limited to such an aspect, and this embodiment may be adopted for cleaning using the roll cleaning member 11*b* (see FIG. 14). In addition, in this case, the roll cleaning member 11*b* may be positioned between the arm part 160 and the back surface of the substrate W to clean both surfaces of the substrate W.

[Effect]

The following description will focus on the functions/effects of this embodiment having the above-described configuration, which have not been described yet. In addition, the aspect described in the "effect" can also be applied to the above "configuration."

When the first support part 110 which is swingable and has the contact region that can contact the peripheral edge of one surface of the substrate W in the closed state and the second support part 120 which supports the other surface of the substrate W are used, the other surface of the substrate W can be supported by the second support part 120 while one surface (front surface) of the substrate W is supported by the first support part 110. Therefore, the configuration of the first support part 110 can be simplified.

Further, by adopting the above-described configuration, it is possible to adopt an aspect which suppresses the protrusion amount D1 of the first support part 110 to one surface side of the substrate W. In other words, the substrate W can be firmly gripped even if the aspect in which the protrusion amount D1 of the first support part 110 to one surface side of the substrate W is small is adopted. For example, the apex or top surface of the tip portion 112*a* of the first support part 110 can also be positioned on one side at a position of 0.5 mm or less, 0.3 mm or less, and 0.25 mm or less from one surface of the substrate W. The protrusion amount D1 is preferably 0.2 mm or less from the viewpoint of suppressing the amount of contact between the cleaning member 11 and the first support part 110 while stably fixing the substrate W. When the above aspect is adopted, the protrusion amount D1 from the substrate W to one side can be reduced, and even if the pencil cleaning member 11*a* is swung and moved to the outside of the peripheral edge of the substrate W or the peripheral edge of the substrate W is included in the roll cleaning member 11*b* for cleaning, the amount of contact between the cleaning member 11 such as the pencil cleaning member 11*a* and the roll cleaning member 11*b* and the first support part 110 can still be suppressed. Therefore, it is possible to prevent the cleaning member 11 from coming off and prevent the support mechanism from losing support or grip of the substrate W. Further, according to this aspect, the service life of the cleaning member 11 can be extended, and the generation of dust due to the wear of the cleaning member 11 can be suppressed. From this viewpoint, it is preferable that the outer surface of the tip portion 112*a* of the first support part 110 on the side opposite to the side of the substrate W (the outer side of the peripheral edge) has a R-shape or a curved surface with no corner, and the vertical cross section that includes the center of the top of the tip portion 112*a* of the first support part 110 in the in-plane direction and that is cut in the plane, which includes the first direction and the direction in which the tangent (see FIG. 6) of the substrate W at the center position in the width direction of the first support part 110 extends (the third direction in FIG. 2), has a substantially semicircular shape or a semicircular shape. The reason is that, by adopting such a shape, the wear of the cleaning member 11 can be suppressed even if the cleaning member 11 contacts the tip portion 112a of the first support part 110 rotating at a high speed from the side surface (left side or right side in FIG. 10). The top of the tip portion 112a of the first support part 110 is not a flat surface, and the top may be a point (apex). In the aspect in which the top of the tip portion 112a of the first support part 110 is a surface, the side portion of the tip portion 112a may draw an arc that widens toward the other side when viewed in the vertical cross section including the center of the top of the tip portion 112a. In addition, when the tip of the tip portion 112a is a point (apex), the tip portion 112a may have a semicircular shape when viewed in the vertical cross section including the center of the top of the tip portion 112a. By swinging and moving the pencil cleaning member 11a to the outside of the peripheral edge of the substrate W or by including the peripheral edge of the substrate W in the roll cleaning member 11b for cleaning, it is possible to meet the needs for cleaning the periphery of the substrate W in recent years. The width of the first support part 110 in the rotation direction of the substrate W (see Z in FIG. 10) may be 10 mm or more, or 11 mm or more. By setting the width to a certain value or more in this way, it is advantageous in that a R-shape with no corner can be formed smoothly.

A partition wall such as a fixed cup or a rotating cup may be provided outside the peripheral edge of the substrate W to prevent the cleaning liquid from scattering. When the fixed cup is provided, a notch may be provided in a predetermined portion of the fixed cup so that the pencil cleaning member 11a swinging in the plane can pass through the notch. Furthermore, the pencil cleaning member 11a may be moved to right before the fixed cup or the rotating cup. When it is important to completely swing to the outside of the peripheral edge of the substrate W, an aspect without the rotating cup may be adopted.

It is conceivable to adsorb the back surface of the substrate to clean the peripheral edge of the substrate W, but in this case, the back surface of the substrate cannot be cleaned. Besides, in the aspect in which the back surface of the substrate is adsorbed, it is required to perform roll cleaning after the cleaning step. In order to efficiently clean the substrate W, generally, roll cleaning with a large cleaning area is performed once and then pencil cleaning with a small cleaning area is performed once, so it is not preferable to perform roll cleaning after pencil cleaning. Therefore, being able to clean the peripheral edge and the back surface of the substrate W as in this embodiment has a very beneficial effect.

Further, it is advantageous in that the wear of the cleaning member 11 can be suppressed even when the width of the tip portion 112a of the first support part 110 is continuously narrowed. The tip portion 112a may not have a circular shape in the vertical cross section as described above and may have a shape like a cone or a truncated cone. However, from the viewpoint of suppressing the wear of the cleaning member 11, as described above, it is beneficial for the tip portion 112a of the first support part 110 to have a R-shape with no corner and have a semicircular shape in the vertical cross section cut in the rotation direction of the substrate W (vertical cross section that includes the center of the top of the tip portion 112a of the first support part 110 in the in-plane direction, and that is cut in the plane including the first direction and the direction in which the tangent (see FIG. 6) of the substrate W at the center position in the width direction of the first support part 110 extends (the third direction in FIG. 2)).

When the first support part 110 has the contact region that contacts only one surface or one surface and the side surface of the substrate W and is configured not to contact the other surface of the substrate W, it is possible to prevent contact between the other surface (back surface) of the substrate W and the first support part 110, and prevent the generation of dust due to the contact. Further, by adopting such a configuration, a space can be formed on the other surface side of the peripheral edge of the substrate W, and a beneficial effect in miniaturizing the device can be obtained.

According to the aspect in which the second support part 120 is provided on the straight line connecting the first support part 110 and the rotation center of the rotated part 20, it is possible to balance the support provided by the first support part 110 on one surface of the substrate W and the support provided by the second support part 120 on the other surface of the substrate W, and reduce the possibility of unexpected tilt of the substrate W.

When the tip portion 112a of the first support part 110 is inclined and protrudes toward the inside of the peripheral edge, the inner surface of the first support part 110 swinging to the inner side can be reliably brought into contact with the substrate W, and the position of the substrate W with respect to the first support part 110 can be prevented from being displaced.

When the swing of the tip portion 112a of the first support part 110 toward the inside of the peripheral edge is realized by a magnetic force, it is possible to reduce the number of members that do not need to contact or contact the first support part 110 in the closed state. The contact of such members results in a risk of generating dust. However, by adopting this aspect, the risk can be reduced. In addition, in the case where a mechanical configuration is used, if the chemical liquid gets in, it cannot be completely removed by cleaning and can become a defect source, but by using a magnet, such a situation can be prevented.

When the first support part 110 includes the first extending portion 111 extending along the in-plane direction of the substrate W, the second extending portion 112 extending to one side from the first extending portion 111, and the bending portion 113 provided between the first extending portion 111 and the second extending portion 112, and the first extending portion 111 is located on the other surface side of the substrate W, the member for setting the first support part 110 to the open state or the closed state can be positioned on the other surface side and the inner side of the substrate W, and the device can be prevented from becoming large in the peripheral edge direction.

When the first magnet 151 is provided in the first extending portion 111 and the second magnet 152 is provided between the substrate W and the first extending portion 111 at the position facing the first magnet 151, the first magnet 151 and the second magnet 152 for setting the tip portion 112a of the first support part 110 to the closed state can be provided as a set. Therefore, the tip portion 112a of the first support part 110 can be opened and closed more reliably.

When a plurality of sets of the first magnets 151 and the second magnets 152 that form pairs are provided, the tip portion 112a of the first support part 110 can be opened and closed more reliably in each set.

When the tip portion of the second support part 120 has a R-shape with no corner and has a semicircular shape (see FIG. 6) in the vertical cross section that includes the center of the top of the tip portion of the second support part 120 in the in-plane direction and that is cut in the plane, which includes the first direction and the direction in which the tangent (see FIG. 6) of the substrate W extends at the center position in the width direction of the first support part 110 closest to the target second support part 120 (the third direction in FIG. 2), the area of contact between the tip portion of the second support part 120 and the other surface (back surface) of the substrate W can be reduced, the back surface of the substrate W is less likely to be contaminated, and liquid pooling can be reduced. Further, since the tip portion has a semicircular shape as described above, it is possible to prevent the pressure on the back surface of the substrate W from becoming too strong. When the tip portion of the second support part 120 is tapered, the cleaning liquid for cleaning the substrate W is less likely to hit the second support part 120, which is also beneficial in preventing liquid splashing. By tapering only the tip portion and thickening the base end portion located on the lower side, it is also advantageous in ensuring the rigidity when supporting the back surface of the substrate W.

When the first support part moving part 140 is provided, which is located on the other side of the first extending portion 111 for moving the first extending portion 111 to one side to move the tip portion 112a of the second extending portion 112 to the outside of the peripheral edge, the tip portion 112a of the second extending portion 112 can be set to the open state by simply moving the first support part moving part 140 to one side. Since the first extending portion 111 is located on the inner side of the substrate W, the centrifugal force applied to the first extending portion 111 can move the first extending portion 111 downward around the swing shaft 130 to impart a supporting force (gripping force) to the substrate W. If the first extending portion 111 is located on the outer side of the substrate W, the first extending portion 111 moves downward around the swing shaft 130. Consequently, a force in the direction away from the substrate W acts, and the supporting force (gripping force) for the substrate W becomes weak.

When the third magnet 143 is provided in the first support part moving part 140 and the first magnet 151 receives a repulsive force due to the magnetic force from the third magnet 143 to move the first extending portion 111 to one side, the tip portion 112a of the first support part 110 can be set to the open state without contact between the first support part moving part 140 and the first extending portion 111. Therefore, it is possible to suppress generation of dust.

When the first support part moving part 140 is continuously provided in a circumferential shape in the plan view, the first support part 110 can be set to the open state by simply moving the first support part moving part 140 to one side regardless of the position of the first support part 110 (when a plurality of first support parts 110 are provided, the plurality of first support parts 110 can be set to the open state at the same time).

When a plurality of first support parts 110 are provided and set to the open state randomly or in order or the supporting forces thereof change during rotation of the substrate W, the cleaning liquid can be poured between the first support part 110 and the substrate W, and it is advantageous in that the portion supported by the first support part 110 can be cleaned. When the first support part 110 is in the open state, it is advantageous in that the cleaning liquid can be reliably poured. It is possible to pour and mix a certain amount of cleaning liquid even if the supporting force is weakened. From the viewpoint of pouring the cleaning liquid while ensuring the support of the substrate W more reliably, the aspect in which the supporting forces of the first support parts 110 change randomly or in order is advantageous.

Furthermore, when a plurality of first support parts 110 are provided and set to the open state randomly or in order or the supporting forces thereof change in the aspect of performing physical cleaning (scrub cleaning), with the first support part 110 set in the open state, even the outer edge E of the substrate W can be reliably scrubbed and cleaned, and not only the surface of the substrate but also at least the upper surface of the bevel portion Wb can be effectively cleaned.

When four or more first support parts 110 are provided and three or more first support parts 110 support the substrate W at a certain time, the other first support parts 110 are set to the open state or the supporting forces of the first support parts 110 are weakened, which is advantageous in that it is possible to more reliably prevent the substrate W from being displaced.

Second Embodiment

Next, the second embodiment of the disclosure will be described.

In the above description, the first support part 110 includes the first extending portion 111 extending along the in-plane direction of the substrate W and the second extending portion 112 extending from the first extending portion 111 to one side, but in this embodiment, the first support part 110 includes a first-direction extending portion 116 that extends along the normal direction of the substrate W. When such a configuration is adopted, the cleaning liquid or the like easily escapes to the other side, which is advantageous in that liquid pooling is less likely to occur. Other configurations are the same as those of the above-described embodiments, and any aspect described in each of the above embodiments can be adopted. The members described in each of the above embodiments will be described using the same reference numerals.

In this embodiment, the first support part moving part 140 is provided outside the first support part 110, and the first support part moving part 140 approaches or comes into contact with the first support part 110 so that the first support part 110 is set to the open state.

Figure 11:
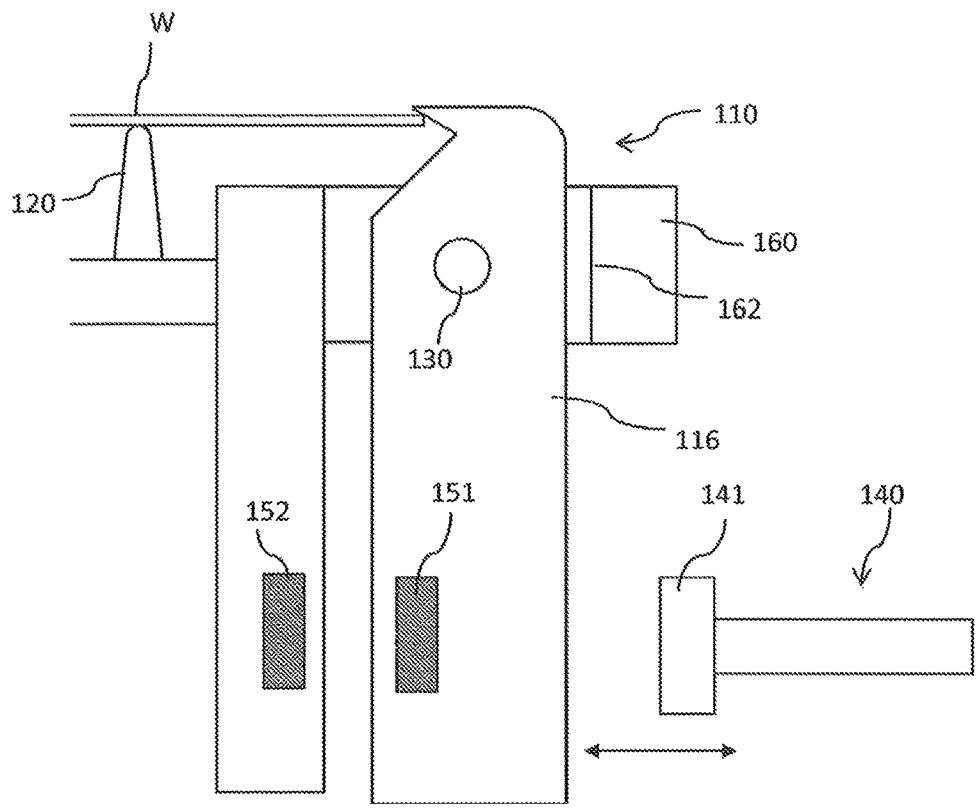
FIG. 11 is a side view showing the substrate support mechanism used as one aspect of the second embodiment of the disclosure.

In the aspect shown in FIG. 11, the first support part moving part 140 moves to the inner side so that the contact portion 141 of the first support part moving part 140 and the outer surface of the first support part 110 contact each other and the first support part 110 is set to the open state.

Figure 12:
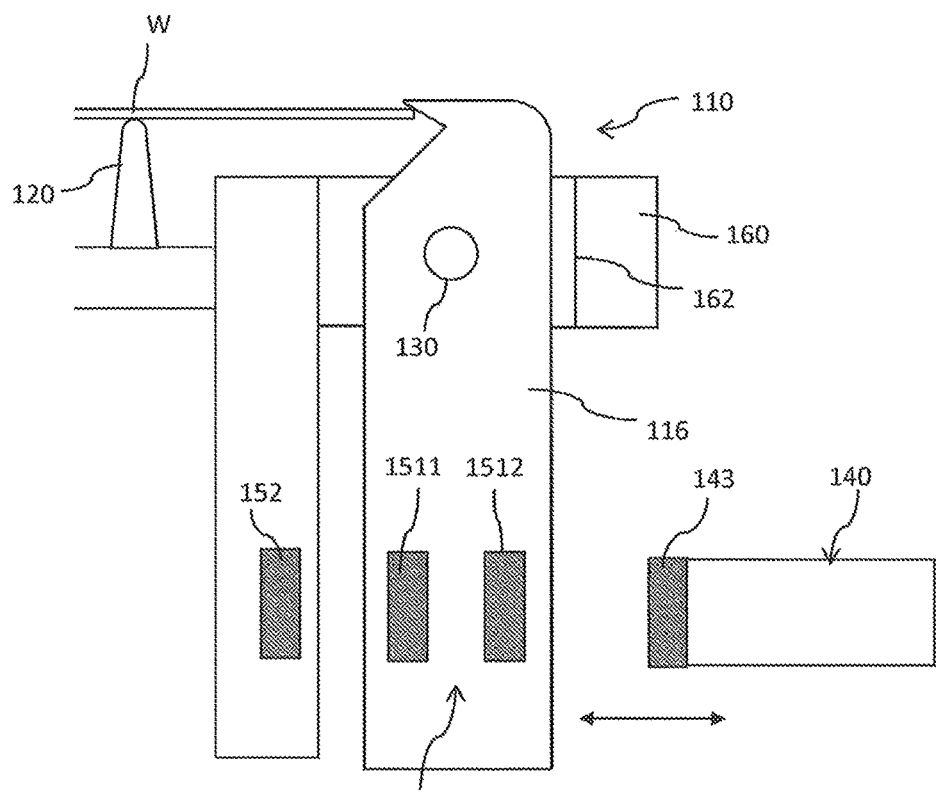
FIG. 12 is a side view showing the substrate support mechanism used as another aspect of the second embodiment of the disclosure.

As shown in FIG. 12, two first magnets 151 may be provided in the first support part 110. More specifically, the first magnet 151 may include a first inner magnet 1511 provided on the inner side for setting the first support part 110 to the closed state by the repulsive force with the second magnet 152, and a first outer magnet 1512 provided on the outer side for setting the first support part 110 to the open state by the repulsive force with the approaching third magnet 143. Then, the first inner magnet 1511 on the inner side sets the first support part 110 to the closed state by the repulsive force with the second magnet 152. On the other hand, the first outer magnet 1512 on the outer side moves to the inside by the magnetic force from the approaching third magnet 143, and as a result, the first support part 110 is set to the open state. In this aspect, the repulsive force between the third magnet 143 and the first outer magnet 1512 when the third magnet 143 moves to the inner side and approaches the first outer magnet 1512 is larger than the repulsive force between the second magnet 152 and the first inner magnet 1511.

The upper portion of the second support part 120 in the first embodiment (FIG. 5, FIG. 6, etc.) and the second embodiment (FIG. 11 and FIG. 12) has a curved surface shape (a semicircular shape in the vertical cross section), but the disclosure is not limited to such an aspect. The upper portion may have a flat surface (parallel to the other surface of the substrate W) when it is desired to further stabilize the support for the other surface (back surface) of the substrate W.

The description of the embodiments and the disclosure of the drawings described above are merely examples for illustrating the invention defined in the claims, and the invention defined in the claims is not limited to the description of the embodiments or the disclosure of the drawings described above. For example, the substrate processing device including the substrate cleaning device according to the disclosure may include a bevel polishing device for polishing the end portion of the substrate W, a back surface polishing device for polishing the back surface of the substrate W or a substrate W plating device for forming a metal film on the surface of the substrate W. In addition, besides the semiconductor substrate W, the substrate W according to the disclosure includes various substrates W such as glass substrates W for a liquid crystal display (LCD), a plasma display (PDP), an organic light emitting diode (OLED), a field emission display, a vacuum fluorescent display (VFD), and a solar cell panel, glass for a magnetic/optical disk, ceramic substrates W, etc.

What is claimed is:

1. A substrate support mechanism, comprising:
   a first support part that has a first contact region capable of coming into contact with a peripheral edge of a substrate in a closed state;
   a second support part capable of supporting a bottom surface of the substrate, wherein the second support part comprises a tip with a second contact region, and wherein the second contact region is configured to contact and support said bottom surface;
   a first support part moving part that can move the first support part from the closed state to an open state,
   wherein, when the substrate is supported on the second support part, the first support part comprises a first extending portion that extends below the bottom surface of the substrate such that a portion of the first extending portion is located vertically below the substrate when the substrate is supported on the second support part, wherein the first support part comprises a second extending portion that extends from the first extending portion, and wherein the first contact region is provided at a tip portion of the second extending portion;
   wherein a first magnet is provided in the first extending portion, wherein a second magnet is provided between the first extending portion and the substrate when the substrate is supported on the second support part, and wherein the first support part is configured to swing into the closed state by a repulsive force between the first magnet and the second magnet.

2. The substrate support mechanism according to claim 1, wherein the first support part does not contact the bottom surface of the substrate.

3. The substrate support mechanism according to claim 1, wherein the second support part is provided between the contact region and a center point of the substrate such that a plane passes through the contact region, the second support part, and said center point.

4. The substate support mechanism according to claim 1, wherein the tip portion of the second extending portion is continuously narrowed in width.

5. The substrate support mechanism according to claim 1, wherein the tip portion of the second extending portion is inclined and protrudes toward the peripheral edge of the substrate.

6. The substrate support mechanism according to claim 1, wherein an apex or a top surface of the tip portion of the second extending portion is located on one side of the substrate at a position of 0.5 mm or less from one surface of the substrate.

7. The substrate support mechanism according to claim 1, wherein the first magnet is part of a set of first magnets, wherein the second magnet is part of a set of second magnets, and wherein the sets of first and second magnets form pairs of magnets; and
   the first magnets and the second magnets rotate together with the substrate when the substrate rotates.

8. The substrate support mechanism according to claim 7, comprising a plurality of arm parts provided below the bottom surface of the substrate and extending toward outside of the peripheral edge of the substrate, and
   the second magnets are provided in the arm parts.

9. The substrate support mechanism according to claim 8, wherein the second support part is provided on one of the arm parts.

10. The substrate support mechanism according to claim 1, wherein the first support part moving part is located below the first extending portion, and moves the first extending portion to move the tip portion of the second extending portion.

11. The substrate support mechanism according to claim 1, wherein a plurality of first support parts are provided, and wherein each of the first support parts are set to an open state randomly or in order when the substrate rotates.

12. The substrate support mechanism according to claim 11, wherein four or more first support parts are provided, and
   at a certain time, three or more first support parts support the substrate, but a remaining first support part does not support the substrate.

13. A substrate cleaning device, comprising:
   the substrate support mechanism according to claim 1; and
   a swing part for swinging a cleaning member for cleaning the substrate,
   wherein the cleaning member is moved to outside of the peripheral edge of the substrate.

14. A substrate processing method, comprising:
   providing a substrate support mechanism as recited in claim 1;
   supporting a substrate on the substate support mechanism;
   rotating the substrate while it is supported on the substrate support mechanism; and
   supplying a cleaning liquid to the substrate,
   wherein a plurality of first support parts are provided on the substrate support mechanism, and wherein each of the first support parts are set to an open state randomly or in order when the substrate rotates.

* * * * *